United States Patent
Yang

(10) Patent No.: US 11,373,723 B2
(45) Date of Patent: Jun. 28, 2022

(54) ENCODER BUILT-IN SELF-TEST CIRCUIT APPLIED IN FLASH MEMORY CONTROLLER AND ASSOCIATED METHOD

(71) Applicant: Silicon Motion Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 312 days.

(21) Appl. No.: 16/278,180

(22) Filed: Feb. 18, 2019

(65) Prior Publication Data

US 2020/0118641 A1 Apr. 16, 2020

(30) Foreign Application Priority Data

Oct. 12, 2018 (TW) .................................. 107135926

(51) Int. Cl.
*G11C 29/14* (2006.01)
*G11C 29/44* (2006.01)
*G06F 3/06* (2006.01)

(52) U.S. Cl.
CPC ............ *G11C 29/14* (2013.01); *G06F 3/0614* (2013.01); *G06F 3/0658* (2013.01); *G06F 3/0679* (2013.01); *G11C 29/44* (2013.01)

(58) Field of Classification Search
CPC ......... G11C 29/14; G11C 29/44; G11C 29/36; G11C 29/40; G11C 29/42; G11C 29/1201; G11C 29/56; G06F 3/0614; G06F 3/0679; G06F 3/0658
See application file for complete search history.

(56) References Cited

U.S. PATENT DOCUMENTS

| | | | | |
|---|---|---|---|---|
| 5,925,144 A | * | 7/1999 | Sebaa | ............ G01R 31/31813 714/733 |
| 8,555,143 B2 | | 10/2013 | Chung | |
| 9,703,627 B2 | * | 7/2017 | Weng | ..................... G11C 29/42 |
| 2009/0249148 A1 | * | 10/2009 | Ito | ....................... G06F 11/1008 714/746 |
| 2015/0074459 A1 | * | 3/2015 | Hong | .................. G06F 11/2236 714/30 |
| 2017/0052225 A1 | | 2/2017 | Lee | |
| 2017/0082684 A1 | * | 3/2017 | Pagani | ............... G01R 31/2884 |
| 2018/0004597 A1 | | 1/2018 | Kwon | |

FOREIGN PATENT DOCUMENTS

| | | |
|---|---|---|
| CN | 1881866 A | 12/2006 |
| CN | 101018102 A | 8/2007 |
| CN | 101452722 A | 6/2009 |
| CN | 108182125 A | 6/2018 |
| TW | 201521032 A | 6/2015 |

* cited by examiner

*Primary Examiner* — Cynthia Britt
*Assistant Examiner* — Rong Tang
(74) *Attorney, Agent, or Firm* — Winston Hsu

(57) ABSTRACT

The present invention provides an encoder built-in self-test (BIST) circuit applied in a flash memory controller, wherein the encoder BIST circuit includes a control circuit and an encoder. In operations of the encoder BIST circuit, without accessing any flash memory, the control circuit generates input data to the encoder, and the encoder encodes the input data to generate a check code to the control circuit, wherein the check code is arranged to determine whether functions of the encoder fail or not.

11 Claims, 3 Drawing Sheets

ENCODER BUILT-IN SELF-TEST CIRCUIT APPLIED IN FLASH MEMORY CONTROLLER AND ASSOCIATED METHOD

BACKGROUND OF THE INVENTION

1. Field of the Invention

The present invention is related to flash memory controllers, and more particularly, to an encoder built-in self-test circuit applied in a flash memory controller, and an associated method.

2. Description of the Prior Art

In a flash memory controller, at least one encoder may be designed to encode input data in order to generate a corresponding check code, which is then written with the input data into a flash memory chip. To assess functional correctness of the encoder, the flash memory controller is connected with the flash memory chip during a test phase performed in a factory, and the flash memory controller is controlled to continuously encode data and then write the encoded data into the flash memory chip. The encoded data is read out from the flash memory chip and decoded in order to determine whether encoding and decoding functions of the flash memory controller are correct. The aforementioned method has the following drawbacks, however. When it is determined that the encoding and decoding functions of the flash memory controller fail, the flash memory chip should be discarded, or must undergo a further debonding process to render the flash memory chip reusable. Further, it is hard to accurately and quickly determine whether the problem is introduced by the encoder or the decoder, which can cause problems for engineers.

SUMMARY OF THE INVENTION

Thus, an objective of the present invention is to provide an encoder built-in self-test (BIST) circuit applied in a flash memory controller which can test an encoder without the need for a flash memory, to solve the aforementioned problems.

In an embodiment of the present invention, an encoder BIST circuit applied in a flash memory controller is disclosed. The encoder BIST circuit comprises a control circuit and an encoder. In operations of the encoder BIST circuit, without accessing any flash memory, the control circuit generates input data to the encoder, and the encoder encodes the input data to generate a check code to the control circuit, wherein the check code is arranged to determine whether functions of the encoder fail or not.

In another embodiment of the present invention, an encoder BIST method applied in a flash memory controller is disclosed. The encoder BIST method comprises the following steps: without accessing any flash memory, generating input data to an encoder; utilizing the encoder to encode the input data to generate a check code; and determining whether functions of the encoder fail or not according to the check code.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
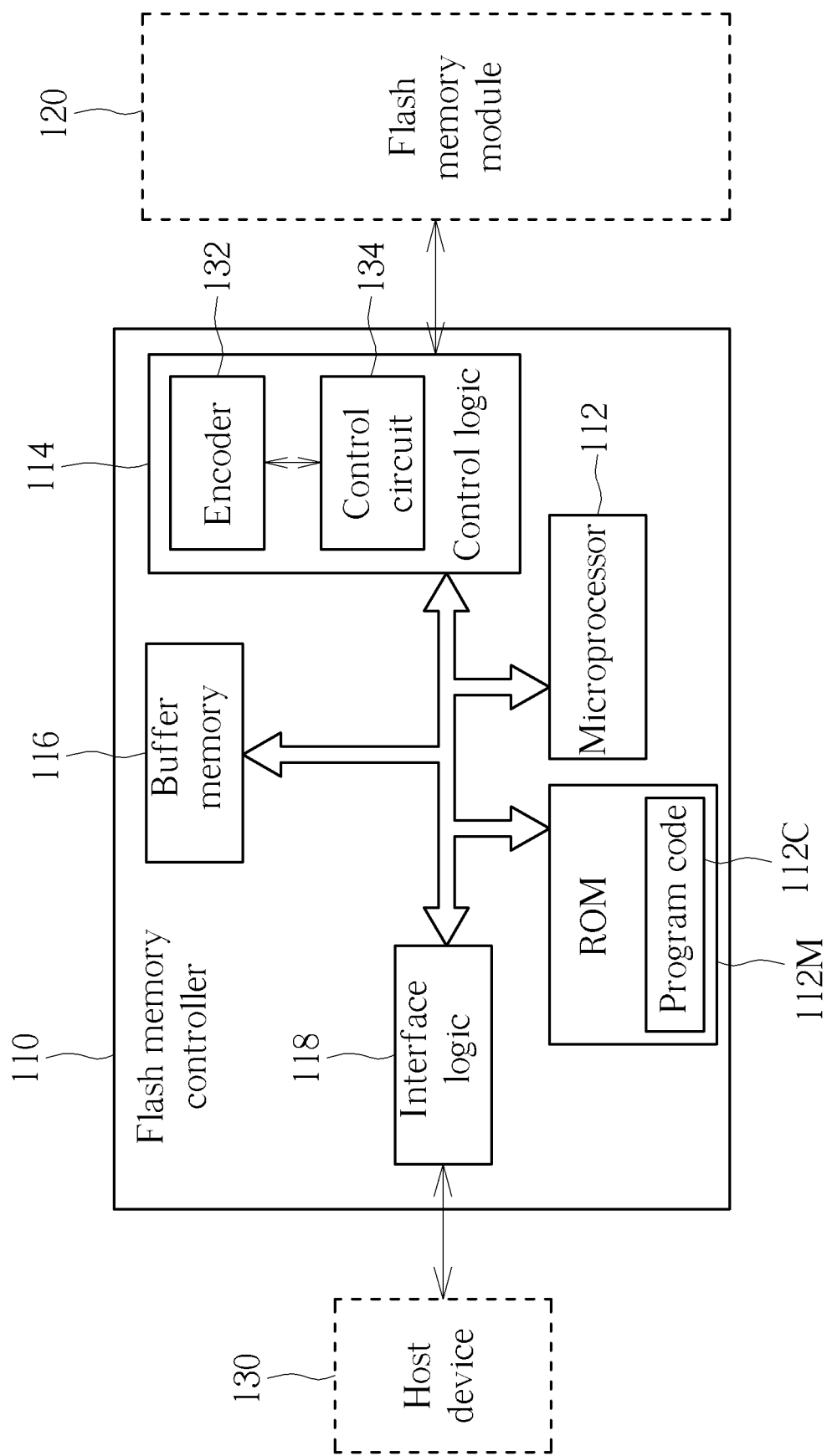
FIG. 1 is a diagram illustrating a flash memory controller according to an embodiment of the present invention.

FIG. 1 is a diagram illustrating a flash memory controller 110 according to an embodiment of the present invention, where the flash memory controller 110 is arranged to connect with a host device 130 and a flash memory module 120, and the flash memory controller 110 is arranged to access the flash memory module 120 according to read/write commands of the host device 130. In this embodiment, the flash memory controller 110 comprises a microprocessor 112, a read only memory (ROM) 112M, a control logic 114, a buffer memory 116 and an interface logic 118. The ROM 112M is arranged to store a program code 112C, and the microprocessor 112 is arranged to execute the program code 112C to control access to the flash memory module 120. The control logic 114 comprises an encoder 132 and a control circuit 134, where the encoder 132 is arranged to encode data that is written into the flash memory module 120 in order to generate a corresponding check code (or error correction code (ECC)). The control circuit 134 is arranged to test the encoder 132, and more particularly, to test the encoder 132 without connecting the flash memory controller with the flash memory module 120.

Under a typical condition, the flash memory module 120 comprises multiple flash memory chips, where each of the multiple chips comprises a plurality of blocks, and the flash memory controller 110 performs an erasing data operation on the flash memory 120 in the unit of blocks. In addition, a block may record a specific number of data pages, where the flash memory controller 110 performs a writing data operation on the flash memory module 120 in the unit of data pages. In this embodiment, the flash memory module 120 is a 3D NAND-type flash memory module.

In practice, the memory controller 110 controlled by a microprocessor 112 through executing the program code 112C may utilize internal components thereof to perform various control operations: for example, utilizing the control logic 114 to control access operations of the flash memory module 120 (more particularly, access operations on at least one block or at least one data page), utilizing the buffer memory 116 to perform required buffer operations, and utilizing the interface logic 118 to communicate with the host device 130. The buffer memory 116 is implemented by a random access memory (RAM): the buffer memory 116 may be a static RAM (SRAM), but the present invention is not limited thereto.

In an embodiment, the flash memory controller 110 may be positioned in a portable memory device (e.g. a memory card conforming to SD/MMC, CF, MS or XD specification), and the host device 130 may be an electronic device that is connectable with a portable memory device; for example, mobile phones, laptop computers, personal computers, etc. In another embodiment, the flash memory controller 110 may be applied in a solid state drive (SSD) or an embedded storage device conforming to an Universal Flash Storage (UFS) or Embedded Multi Media Card (EMMC) specification, for being configured in an electronic device (for example, in a mobile phone, a laptop computer or a personal computer), and the host device 130 may be a processor of this electronic device.

Figure 2:
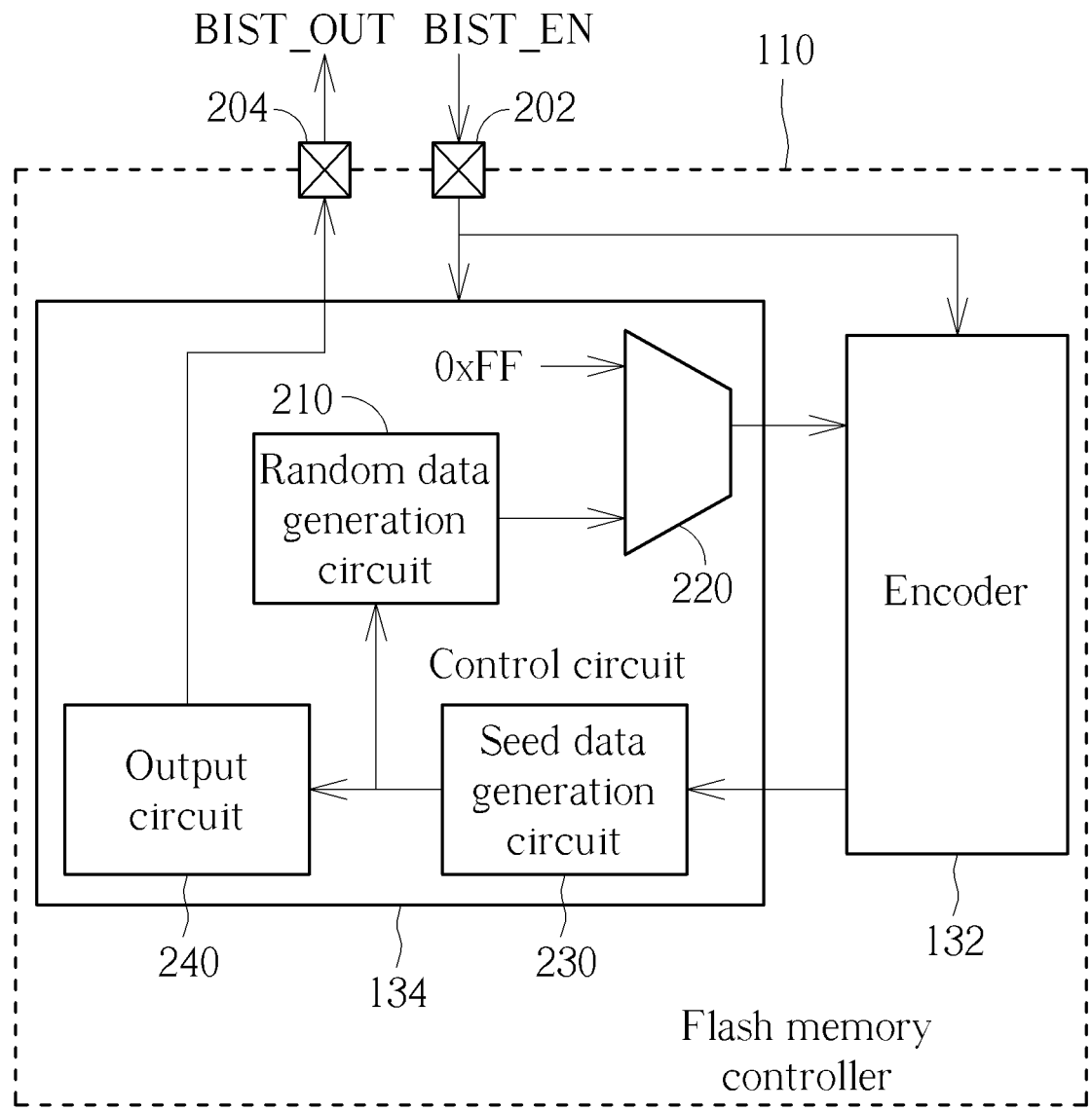
FIG. 2 is a diagram illustrating an encoder and a control circuit according to an embodiment of the present invention.

FIG. 2 is a diagram illustrating the encoder 132 and the control circuit 134 according to an embodiment of the present invention. As shown in FIG. 2, the control circuit 134 comprises a random data generation circuit 210, a multiplexer 220, a seed data generation circuit 230 and an output circuit 240. In this embodiment, the control circuit 134 and the encoder 132 are taken as an encoder BIST circuit, and whether functions of the encoder 132 fail may be determined through detecting (or checking) operations of the control circuit 134 and the encoder 132. Additionally, a self-test (e.g. BIST) operation of the control circuit 134 and the encoder 132 is performed during a chip probe (CP) phase within a wafer level test, or during a final test (FT) phase within a package level test. Thus, the self-test operation of the encoder 132 does not perform any access operation on the flash memory module 120, and the flash memory controller 110 is not connected with the flash memory module 120 at this moment.

In the operations of the embodiment shown in FIG. 2, during the CP phase within the wafer level test or the FT phase within the package level test, an engineer may input a self-test enable signal BIST_EN from outside (e.g. outside of the flash memory controller 110) through a pad or a pin 202 of the flash memory controller 110, to activate the encoder 132 and the control circuit 134 to perform a self-test operation. It should be noted that FIG. 2 illustrates the self-test enable signal BIST_EN being directly inputted into the encoder 132 and the control circuit 134, but the present invention is not limited thereto. In other embodiments, the flash memory controller may comprise another circuit arranged to receive the self-test enable signal BIST_EN and accordingly activate the encoder 132 and the control circuit 134, and these alternative designs also fall within the scope of the present invention.

The control circuit 134 may generate first input data to the encoder 132, so the encoder 132 can encode the first input data to generate a corresponding check code. More particularly, the multiplexer 220 may be switched to the upper channel, to take a predetermined input data as the first input data for being transmitted into the encoder 132, where the predetermined input data in this embodiment is data with logic values that are all "1" (0xFF), and the size of this data is 2 kilo bytes (KB), but the present invention is not limited thereto. Then, the encoder 132 may encode the predetermined input data by, for example, a decoding method of low-density parity-check (LDPC) code, to generate a first check code, where the size of a check code (e.g. the first check code) is associated with a design of the encoder 132; for example, it may be 248 bits. Then, the seed data generation circuit 230 performs a cyclic redundancy check (CRC) operation or any suitable hash calculation operation on the first check code, to compress the first check code as first seed data (e.g. 16-bit seed data), where the first seed data is arranged for the random data generation circuit 210 to generate second input data with a size of 2 KB.

The aforementioned operations of utilizing the multiplexer 220 to output the first input data to the encoder 132, utilizing the encoder 132 to generate the first check code to the seed data generation circuit 230, and utilizing the seed data generation circuit 230 to generate the first seed data to the random data generation circuit 210, may be regarded as a first loop operation.

Then, in a second loop operation, the multiplexer 220 may switch to the lower channel to transmit the second input data generated by the random data generation circuit 210 to the encoder 132. The encoder then encodes the second input data to generate second check code to the seed data generation circuit 230, and the seed data generation circuit 230 compresses the second check code as second seed data, where the second seed data is arranged for the random data generation circuit 210 to generate third input data with a size of 2 KB.

In a third loop operation, the multiplexer 220 may be kept in the lower channel to transmit the third input data generated by the random data generation circuit 210 to the encoder 132. The encoder then encodes the third input data to generate third check code to the seed data generation circuit 230, and the seed data generation circuit 230 compresses the third check code as third seed data, where the third seed data is arranged for the random data generation circuit 210 to generate fourth input data with a size of 2 KB.

After performing a specific number of loop operations, for example, after N loop operations, the output circuit 240 may determine the correctness of $N^{th}$ seed data generated by the seed data generation circuit 230, to determine whether the functions of the encoder 132 fail or not, and output a determination result BIST_OUT through a pad or a pin 204 to another device for reference by an engineer. More particularly, since the engineer may know a correct value of the $N^{th}$ seed data generated by the encoder 132 and the control circuit 134 after performing N loop operations through a simulation, this correct value may be stored in the control circuit 134 in advance or may be inputted by the engineer. Therefore, the output circuit 240 is able to compare the $N^{th}$ seed data generated by the seed data generation circuit 230 after N loop operations with this correct value. If the comparison result indicates that the $N^{th}$ seed data matches this correct value, it means the functions of the encoder 132 are normal, and if the comparison result indicates that the $N^{th}$ seed data does not match this correct value, it means the functions of the encoder 132 are abnormal (e.g. the functions fail).

In another embodiment of the present invention, the output circuit 240 may directly transmit the $N^{th}$ seed data generated by the seed data generation circuit 230 to another electronic device through the pad or the pin 204, to allow the engineer to determine whether the functions of the encoder 132 fail or not.

In the embodiment shown in FIG. 2, the output circuit 240 compares the $N^{th}$ seed data with this correct value to determine whether the functions of the encoder 132 fail or not. In another embodiment, the output circuit 240 may also compare an $N^{th}$ check code generated by the encoder 132 with a correct check code to determine whether the functions of the encoder 132 fail or not. These alternative designs fall within the scope of the present invention.

Through the aforementioned self-test operation, it can be quickly and effectively determined whether the functions of the encoder 132 fail, and there is no need for accessing any flash memory such as the flash memory module 120. Further, the test can be performed independently on the flash memory controller 110. The problems of the related art, such as the need for performing further debonding processes on the connected flash memory module 120, can be avoided when the functions of the encoder 132 fail. Additionally, since the self-test operation of the encoder 132 in this embodiment does not involve a decoding operation, there is no need for the decoder positioned in the control logic 114; therefore, the problems of the related art, such as the need for further determining whether the abnormal functions are introduced by the encoder or the decoder, can be avoided.

After the self-test operation is finished, the engineer may stop inputting the self-test enable signal BIST_EN into the flash memory controller 110, to stop the operations of the encoder 132 and the control circuit 134.

In the above embodiments, the number of loop operations (e.g. the aforementioned "N") performed by the encoder 132 and the control circuit 134 may be any suitable value. Considering that a portion of circuits within the encoder 132 might take a long time to perform the test due to process factors, the encoder 132 and the control circuit 134 may need a high number of loop operations; for example, N may be greater than one thousand, greater than one hundred thousand, or even one million, to make defects within the encoder 132 appear during multiple loop operations. In addition, the engineer may design these loop operations to prevent the same seed data being generated during these loop operations; for example, any two of the first seed data to the $N^{th}$ seed data are not the same, in order to make the encoder 132 and the control circuit 134 be able to perform a more complete and comprehensive test.

Figure 3:
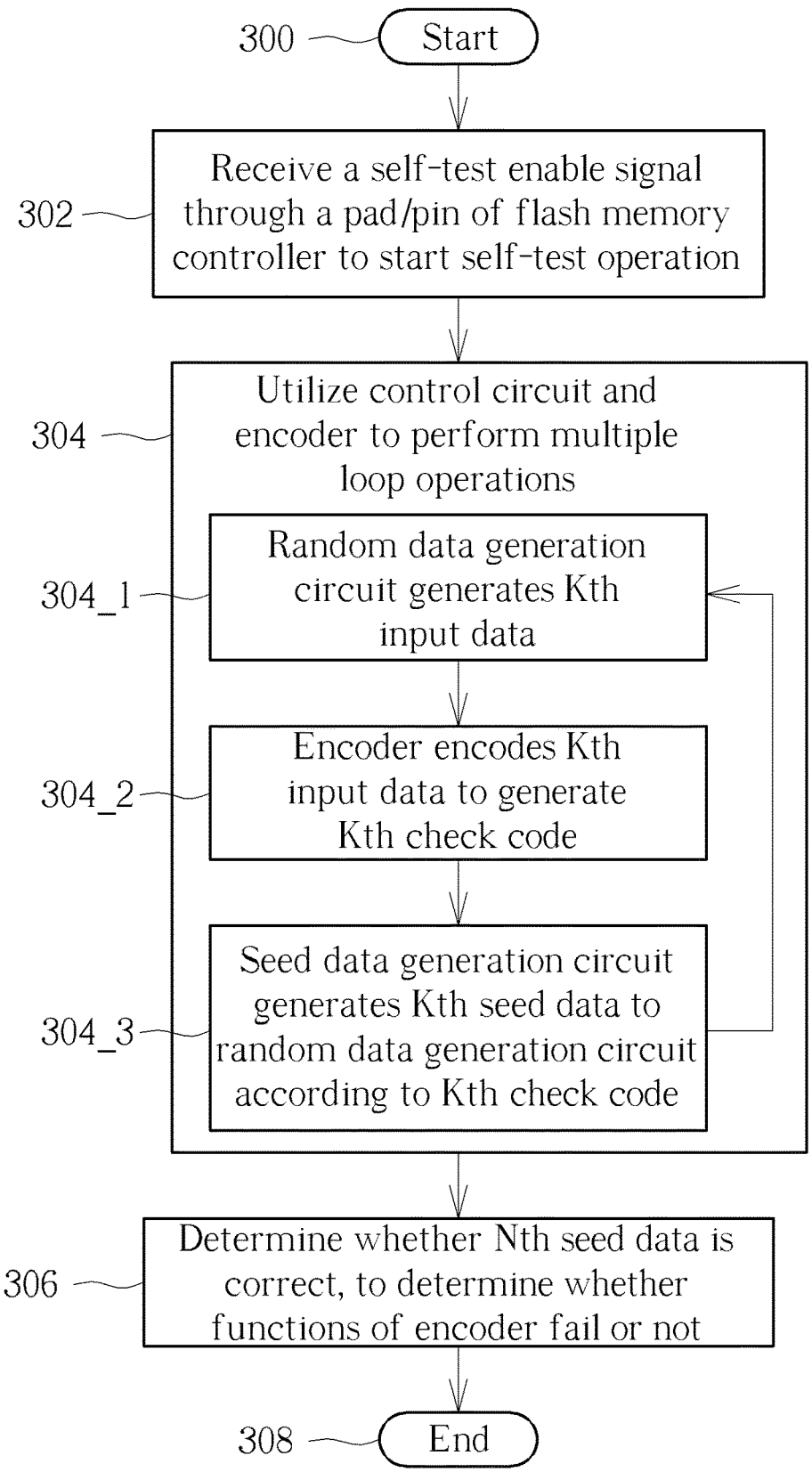
FIG. 3 is a flowchart illustrating an encoder BIST method applied in a flash memory controller according to an embodiment of the present invention.

FIG. 3 is a flowchart illustrating an encoder BIST method applied in a flash memory controller according to an embodiment of the present invention. Referring to the embodiments of FIGS. 1 and 2 mentioned above, the working flow of FIG. 3 is as follows.

Step 300: the flow starts.

Step 302: receive a self-test enable signal through a pad/pin of the flash memory controller to start the self-test operation.

Step 304: utilize a control circuit and an encoder to perform multiple loop operations, where each of the loop operations comprises the following steps 304_1, 304_2 and 304_3:

Step 304_1: the random data generation circuit generates $K^{th}$ input data;

Step 304_2: the encoder encodes the $K^{th}$ input data to generate a $K^{th}$ check code;

Step 304_3: the seed data generation circuit generates $K^{th}$ seed data to the random data generation circuit according to the $K^{th}$ check code, and then the flow returns to Step 304_1 to generate $(K+1)^{th}$ input data.

Step 306: determine whether $N^{th}$ seed data is correct, to determine whether functions of the encoder fail or not.

Step 308: finish the self-test operation.

Briefly summarized, the encoder BIST circuit applied in a flash memory controller disclosed in the present invention can test an encoder within the flash memory controller without connecting with a flash memory module, to accurately determine whether functions of the encoder fail or not. The flash memory controller can thereby independently perform an encoding function test, and the problems of the related art (e.g. the need for connection between the flash memory controller and the flash memory module during the test, which introduces the need for performing a debonding process on the connected flash memory module when the flash memory controller is abnormal) can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An encoder built-in self-test (BIST) circuit applied in a flash memory controller, comprising:
   a control circuit; and
   an encoder;
   wherein, without accessing any flash memory, the control circuit generates input data to the encoder, and the encoder encodes the input data to generate a check code to the control circuit, wherein the check code is arranged to determine whether functions of the encoder fail or not;
   wherein the control circuit and the encoder perform multiple loop operations, and each of the loop operations comprises:
   (a) utilizing the control circuit to generate $K^{th}$ input data to the encoder, wherein K is a positive integer; and
   (b) utilizing the encoder to encode the $K^{th}$ input data to generate a $K^{th}$ check code, wherein the $K^{th}$ check code is used by the control circuit to generate $(K+1)^{th}$ input data of the encoder in a next loop operation;
   wherein an $N^{th}$ check code generated by the encoder is arranged to determine whether the functions of the encoder fail or not, wherein N is a predetermined value equal to or greater than three.

2. The encoder BIST circuit of claim 1, wherein the control circuit comprises:
   a random data generation circuit, arranged to generate the $(K+1)^{th}$ input data to the encoder; and
   a seed data generation circuit, coupled to the random data generation circuit, arranged to generate seed data to the random data generation circuit according to a $(K+1)^{th}$ check code, to allow the random data generation circuit to generate $(K+2)^{th}$ input data.

3. The encoder BIST circuit of claim 2, wherein the seed data generation circuit performs a cyclic redundancy check (CRC) operation on the $K^{th}$ check code to generate the seed data.

4. The encoder BIST circuit of claim 2, wherein the control circuit further comprises:
   a multiplexer, arranged to selectively transmit predetermined input data or the $(K+1)^{th}$ input data generated by the random data generation circuit to the encoder, wherein the predetermined input data is first data generated by the control circuit to the encoder.

5. An encoder built-in self-test (BIST) method applied in a flash memory controller, comprising:
   without accessing any flash memory:
      generating input data to an encoder;
      utilizing the encoder to encode the input data to generate a check code; and
   determining whether functions of the encoder fail or not according to the check code;
   wherein the operation of generating the input data is performed by a control circuit, the control circuit and the encoder perform multiple loop operations, and each of the loop operations comprises:
   (a) utilizing the control circuit to generate a $K^{th}$ input data to the encoder,
      wherein K is a positive integer; and
   (b) utilizing the encoder to encode the $K^{th}$ input data to generate a $K^{th}$ check code, wherein the $K^{th}$ check code is used by the control circuit to generate $(K+1)^{th}$ input data of the encoder in a next loop operation;
   wherein an $N^{th}$ check code generated by the encoder is arranged to determine whether the functions of the encoder fail or not, wherein N is a predetermined value equal to or greater than three.

6. The encoder BIST method of claim 5, wherein the step of generating the input data to the encoder comprises:
   activating a control circuit to generate the input data to the encoder after receiving a self-test enable signal from outside of the flash memory controller.

7. The encoder BIST method of claim 6, wherein the self-test enable signal is inputted from a pad or a pin of the flash memory controller.

8. The encoder BIST method of claim 7, wherein the self-test enable signal is inputted during a chip probe (CP) phase within a wafer level test, or inputted during a final test (FT) phase within a package level test.

9. The encoder BIST method of claim 5, wherein the step of determining whether the functions of the encoder fail or not according to the check code comprises:
   determining whether the check code or seed data generated by compressing the check code matches predetermined data, to determine whether the functions of the encoder fail or not.

10. The encoder BIST method of claim 5, wherein the step of determining whether the functions of the encoder fail or not according to the check code comprises:
   transmitting the check code or seed data generated by compressing the check code to another device through a pad or a pin of the flash memory controller, to allow said other device to determine whether the check code or the seed data matches predetermined data, to determine whether the functions of the encoder fail or not.

11. The encoder BIST method of claim 5, wherein each of the loop operations further comprises:
   generating seed data to the control circuit according to the $K^{th}$ check code, to allow the control circuit to generate $(K+1)^{th}$ input data.

\* \* \* \* \*